(12) United States Patent
Kim et al.

(10) Patent No.: US 9,894,755 B2
(45) Date of Patent: Feb. 13, 2018

(54) FLEXIBLE DISPLAY AND METHOD OF MANUFACTURING THE SAME

(71) Applicant: Samsung Display Co., Ltd., Yongin-si, Gyeonggi-do (KR)

(72) Inventors: Myunghwan Kim, Yongin-si (KR); Myeonghee Kim, Yongin-si (KR); Sanggil Lee, Yongin-si (KR); Heekeun Lee, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 230 days.

(21) Appl. No.: 14/971,530

(22) Filed: Dec. 16, 2015

(65) Prior Publication Data
US 2016/0374191 A1    Dec. 22, 2016

(30) Foreign Application Priority Data

Jun. 17, 2015    (KR) ........................ 10-2015-0086171

(51) Int. Cl.
*F21V 29/00*    (2015.01)
*H05K 1/02*    (2006.01)
*H01L 23/12*    (2006.01)

(52) U.S. Cl.
CPC .............. *H05K 1/028* (2013.01); *H01L 23/12* (2013.01); *H05K 2201/10128* (2013.01)

(58) Field of Classification Search
CPC ......... H01L 27/00; H01L 23/12; H05K 1/028; H05K 2201/10128
See application file for complete search history.

(56) References Cited

U.S. PATENT DOCUMENTS

| 6,618,111 | B1 | 9/2003 | Nagata et al. |
| 8,890,155 | B2 | 11/2014 | Kim et al. |
| 2003/0062542 | A1* | 4/2003 | Murade ................. G02F 1/1345 257/200 |
| 2007/0091232 | A1* | 4/2007 | Kim .................. G02F 1/133305 349/113 |
| 2011/0149196 | A1* | 6/2011 | Tanaka .............. G02F 1/133308 349/58 |
| 2012/0127405 | A1* | 5/2012 | Lee ..................... G02F 1/13336 349/106 |

(Continued)

FOREIGN PATENT DOCUMENTS

| JP | 2012-116087 A | 6/2012 |
| KR | 10-2014-0064156 A | 5/2014 |

(Continued)

*Primary Examiner* — Ali Alavi
(74) *Attorney, Agent, or Firm* — Knobbe, Martens, Olson & Bear, LLP

(57) ABSTRACT

A flexible display and a method of manufacturing the same are disclosed. In one aspect, the flexible display includes a flexible display panel including an active area configured to display an image and an inactive area surrounding the active area. The flexible display also includes a plurality of wires formed over the flexible display panel in the inactive area and configured to transmit an electric signal to the active area. The inactive area includes a plurality of edges that are bent with respect to the active area of the flexible display panel. A bending hole is formed at each corner where two adjacent edges of the flexible display panel meet and each of the corners is folded so as to define a folding region.

20 Claims, 7 Drawing Sheets

(56) References Cited

U.S. PATENT DOCUMENTS

| | | |
|---|---|---|
| 2012/0133711 A1 | 5/2012 | Hiwada |
| 2013/0148072 A1 | 6/2013 | Jang et al. |
| 2014/0183473 A1 | 7/2014 | Lee et al. |
| 2014/0353670 A1 | 12/2014 | Youn et al. |

FOREIGN PATENT DOCUMENTS

| | | |
|---|---|---|
| KR | 10-2014-0118222 A | 10/2014 |
| KR | 10-2014-0140150 A | 12/2014 |

\* cited by examiner

FLEXIBLE DISPLAY AND METHOD OF MANUFACTURING THE SAME

CROSS-REFERENCE TO RELATED APPLICATIONS

This application claims the benefit of Korean Patent Application No. 10-2015-0086171, filed on Jun. 17, 2015, in the Korean Intellectual Property Office, the disclosure of which is incorporated herein in its entirety by reference.

BACKGROUND

Field

The described technology generally relates to a flexible display and a method of manufacturing the same.

Description of the Related Technology

Display devices are often used in mobile devices, such as smart phones, laptop computers, digital cameras, camcorders, portable information terminals, or tablet computers. They are also often used in electronic devices, such as desktop computers, televisions, outdoor billboards, or exhibition displays.

Recently, slim displays have been developed. One particular slim display that has been recognized as a next-generation display is a flexible display that is portable and can be configured into one of various different shapes.

SUMMARY OF CERTAIN INVENTIVE ASPECTS

One inventive aspect is a flexible display and a method of manufacturing the same.

Additional aspects will be set forth in part in the description which follows and, in part, will be apparent from the description, or may be learned by practice of the presented embodiments.

Another aspect is a flexible display including a flexible display panel including an active area displaying an image, and an inactive area surrounding the active area; and a plurality of wires formed in the inactive area and transmitting an electric signal to the active area, wherein the inactive area includes a plurality of edges that are bent in one direction of the flexible display panel, a bending hole is formed at a corner where two adjacent edges of the flexible display panel meet, and a folding region that is folded at least once is formed at the corner.

In one embodiment, the bending hole does not overlap the plurality of wires.

The bending hole can be formed between the plurality of wires and the active area.

The bending hole can penetrate through the flexible display panel in a thickness direction thereof.

The bending hole can be a closed curve surrounded by regions of the plurality of edges.

The bending hole can extend throughout two adjacent edges.

The folding region can be formed on the two adjacent edges at the corner in an overlapping manner.

Wires extending to the two adjacent edges and passing through the corner can be formed on the folding region.

The plurality of edges can be folded at least once in a direction opposite to a direction in which the flexible display panel displays an image.

The plurality of edges can be folded together to a surface opposite to a surface the flexible display panel displays an image.

The inactive area can surround the active area, and the plurality of edges can be folded in a direction opposite to a direction in which the flexible display panel displays an image, along a circumference of the active area.

The inactive area can include a plurality of first inactive areas facing each other in a first direction across the active area, and a plurality of second inactive areas facing each other in a second direction crossing the first direction, wherein the bending hole can be formed at a corner where a first edge of one of the plurality of first inactive areas and a second edge of one of the plurality of second inactive areas, which are adjacent to each other, meet.

The active area can have a quadrangular shape, and the plurality of edges can be folded together at four surfaces.

The flexible display panel can include: at least one flexible substrate; a plurality of devices formed on the at least one flexible substrate; and a plurality of insulating layers insulating the plurality of devices from each other, wherein a reinforcing film can be further attached on the at least one flexible substrate.

The bending hole can penetrate through the at least one flexible substrate and the reinforcing film at a same location in a thickness direction of the flexible display panel.

The at least one flexible substrate can include any one selected from a flexible glass substrate and a flexible polymer substrate.

A radius of curvature of the flexible display panel can be less than or equal to about 1 mm.

Another aspect is a method of manufacturing a flexible display including: a flexible display panel including an active area displaying an image, and an inactive area surrounding the active area and including a plurality of edges that bend in one direction of the flexible display panel; and a plurality of wires formed in the inactive area and transmitting an electric signal to the active area, the method includes: forming a bending hole at a corner where two adjacent edges of the flexible display panel meet; bending the plurality of edges of the inactive area in one direction of the flexible display panel; and forming a folding region by folding the corner at least once.

The plurality of edges can be folded at least once in a direction opposite to a direction in which the flexible display panel displays an image, and the folding region can be formed on the two adjacent edges at the corner in an overlapping manner.

The plurality of edges can be folded together to a surface opposite to a surface the flexible display panel displays an image.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION OF CERTAIN INVENTIVE EMBODIMENTS

Figure 1:
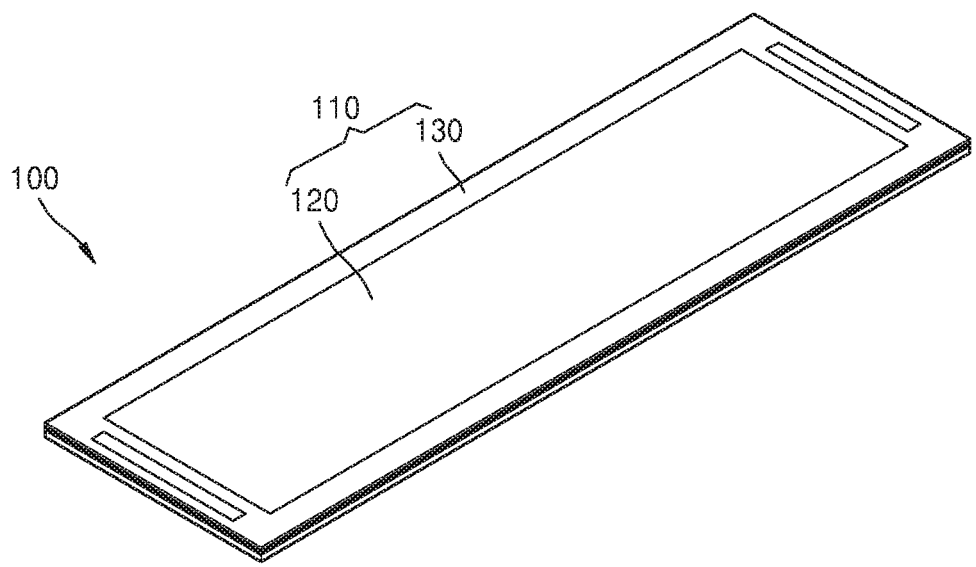
FIG. 1 is a perspective view of a flexible display before being folded, according to an exemplary embodiment.

As the described technology allows for various changes and numerous embodiments, exemplary embodiments will be illustrated in the drawings and described in detail in the written description. However, this is not intended to limit the described technology to particular modes of practice, and it will to be appreciated that all changes, equivalents, and substitutes that do not depart from the spirit and technical scope of the described technology are encompassed within the described technology. In the following description, certain detailed explanations of the related technology may be omitted when it is deemed that they may unnecessarily obscure the essence of the described technology.

While such terms as "first", "second", etc., may be used to describe various components, such components must not be limited to the above terms. The above terms are used only to distinguish one component from another.

The terms used in the present specification are merely used to describe particular embodiments, and are not intended to limit the described technology. An expression used in the singular encompasses the expression in the plural, unless it has a clearly different meaning in the context. In the present specification, it is to be understood that terms such as "including" or "having", etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

A flexible display and a method of manufacturing the same, according to exemplary embodiments, will be described below with reference to the accompanying drawings. Those components that are the same or are in correspondence may be given the same reference numeral regardless of the figure number, and redundant explanations thereof may be omitted.

FIG. 1 is a perspective view of a flexible display 100 before being folded, according to an exemplary embodiment.

Referring to FIG. 1, the flexible display 100 includes a flexible display panel 110. The flexible display panel 110 includes an active area 120 that can display an image and an inactive area 130 surrounding the active area 120. The flexible display 100 can include not only a functional layer for realizing or displaying an image, but can also include at least one of various films, such as a touch screen, a polarizing plate, and a casing.

According to an exemplary embodiment, the flexible display 100 can be an organic light-emitting diode (OLED) display, a liquid crystal display (LCD), a field emission display (FED), or an electronic paper display (ED).

Figure 2A:
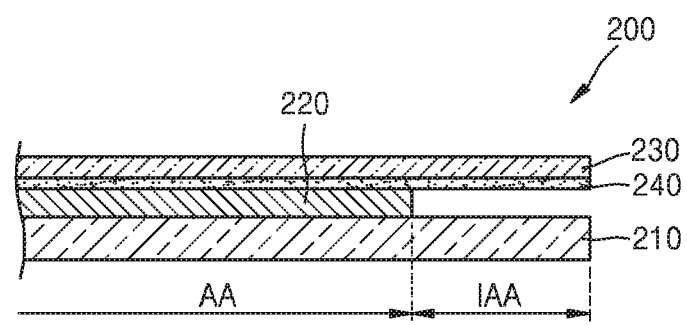
FIG. 2A is a partial cross-sectional view of a stacked structure of a flexible display panel, according to an exemplary embodiment.
Figure 2B:
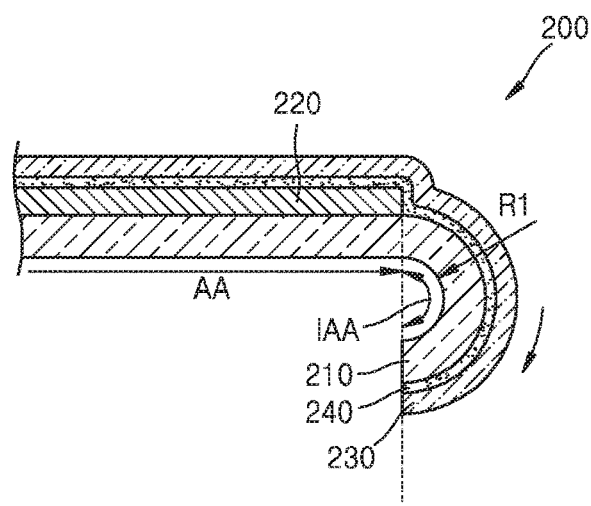
FIG. 2B is a partial cross-sectional view of the flexible display panel of FIG. 2A, which is folded.

FIG. 2A is a partial cross-sectional view of a stacked structure of a flexible display panel 200, according to an exemplary embodiment. FIG. 2B is a partial cross-sectional view of the flexible display panel 200 of FIG. 2A, which is folded.

Referring to FIG. 2A, the flexible display panel 200 includes a flexible substrate 210. The flexible substrate 210 can be any one of a flexible glass substrate and a flexible polymer substrate.

The flexible substrate 210 can be divided into an active area AA that can display an image and an inactive area IAA surrounding the active area AA. A functional layer 220 including a plurality of devices realizing or displaying an image and a plurality of insulating layers insulating the devices can be formed in the active area AA. Although not illustrated, wires and drivers, which extend from the active area AA and are electrically connected to an external circuit board, can be formed in the inactive area IAA.

A reinforcing film 230 can be attached on the flexible substrate 210. The reinforcing film 230 can be attached on the flexible substrate 210 by using an adhesive layer 240. According to the current embodiment, the reinforcing film 230 is attached throughout the active area AA and the inactive area IAA, but the embodiments of the described technology are not limited thereto. For example, the reinforcing film 230 can be attached only in the active area AA.

The reinforcing film 230 can be provided to reinforce the rigidity of the flexible substrate 210 when the flexible display panel 200 is folded. An optical characteristic of the reinforcing film 230 can be the same as an optical characteristic of the flexible substrate 210. According to an exemplary embodiment, the reinforcing film 230 is a polarization film.

For example, the reinforcing film 230 can be attached on a top surface of the functional layer 220 in the active area AA by using the adhesive layer 240, and attached directly on a top surface of the flexible substrate 210 in the inactive area IAA. The reinforcing film 230 can integrally extend throughout the active area AA and the inactive area IAA.

Referring to FIG. 2B, the flexible display panel 200 can be folded in one direction. According to the current embodiment, the flexible display panel 200 can be folded in one direction (i.e., in the direction indicated by the arrow) of the flexible display panel 200. Here, the inactive area IAA is folded in one direction so as to increase the relative size of the active area AA and decrease the size of a bezel. According to an exemplary embodiment, the radius of curvature R1 of the flexible display panel 200 can be less than or equal to about 1 mm.

When the flexible display panel 200 is folded in one direction, the inactive area IAA can be folded at a corner of the flexible display panel 200 without interference.

Figure 3A:
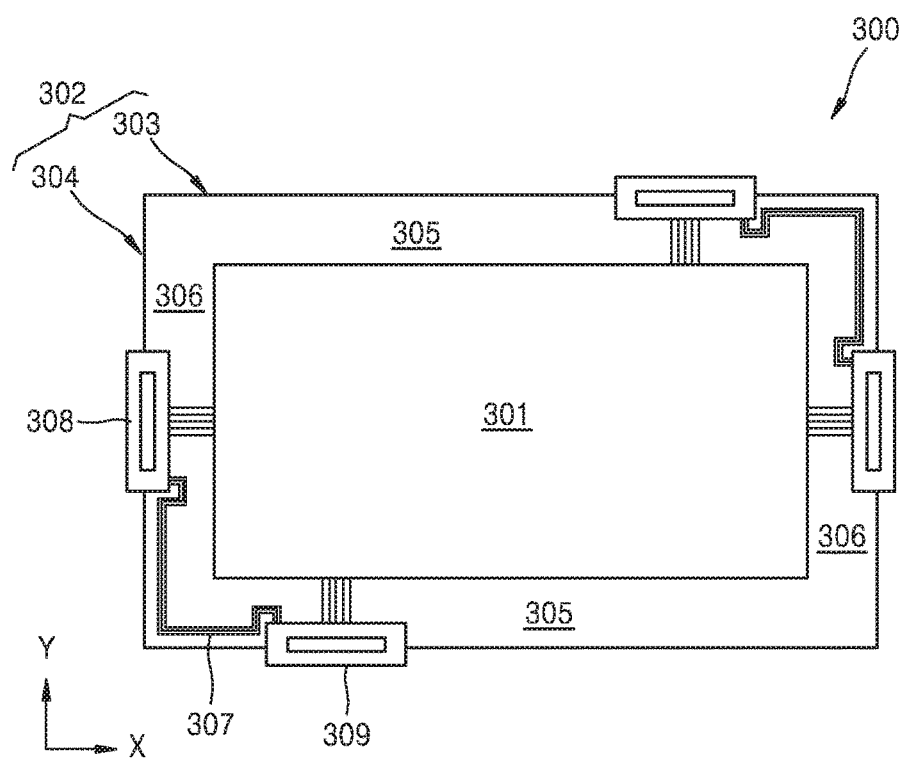
FIG. 3A is a plan view of a flexible display panel according to an exemplary embodiment, which is unfolded.

FIG. 3A is a plan view of a flexible display panel 300 according to an exemplary embodiment, which is unfolded.

As described above with reference to FIG. 2, the flexible display panel 300 also includes a reinforcing film attached to a flexible substrate by using an adhesive layer throughout the active area AA and the inactive area IAA.

Referring to FIG. 3A, the flexible display panel 300 includes an active area 301 displaying an image and an inactive area 302 surrounding the active area 301.

The active area 301 can have a rectangular shape. However, the shape of the active area 301 is not limited thereto, and can be a polygon in certain embodiments.

The inactive area 302 surrounds a circumference of the active area 301. The inactive area 302 includes a plurality of first inactive areas 303 facing each other in a first direction (a Y-direction) across the active area 301, and a plurality of second inactive areas 304 facing each other in a second direction (a X-direction) across the active area 301. The second direction may cross the first direction.

The inactive area 302 can include a plurality of first and second edges 305 and 306, which can be folded in a direction opposite to a direction in which the flexible display panel 300 displays an image, i.e., in a downward direction of the flexible display panel 300. According to the current embodiment, the first edges 305 are formed in the first inactive areas 303, and the second edges 306 are formed in the second inactive areas 304. In one embodiment, the first inactive areas 303 having the first edges 305 correspond to the long sides of the flexible display panel 300, which extend in the X-direction, and the second inactive areas 304 having the second edges 306 correspond to the short sides of the flexible display panel 300, which extend in the Y-direction.

A plurality of wires 307 can be formed in the inactive area 302. The wires 307 can transmit electric signals to the active area 301.

A plurality of drivers, such as a gate driver 308 and a data driver 309, which are electrically connected to devices in the active area 301 via the wires 307, can be arranged in the inactive area 302. For example, the gate driver(s) 308 can be placed over the first edge(s) 305 and transmit a gate driving signal to the active area 301. Similarly, the data driver(s) 309 can be played over the second edge(s) 306 and transmit an image signal to the active area 301.

The gate driver 308 and the data driver 309 can be combined and/or electrically connected to each other within the active area 301 in any one of various forms, and can drive pixels (not shown) arranged in the active area 301 by respectively transmitting a scan signal and an image signal (data signal) to gate lines (not shown) and data lines (not shown) formed in the active area 301.

The inactive area 302 can be folded in one direction during the manufacturing of the flexible display panel 300. According to an exemplary embodiment, the area of a surface of the inactive area 302 around the active area 301 is reduced, and the first and second edges 305 and 306 can be folded in a direction different from a direction towards a surface where the active area 301 is formed.

According to an exemplary embodiment, the first and second edges 305 and 306 can be folded together. According to the current embodiment, four surfaces of the flexible display panel 300 are folded together in an opposite direction in which the flexible display panel 200 displays an image, i.e., toward a rear surface of the flexible display panel 300, but the described technology is not limited thereto.

Figure 3B:
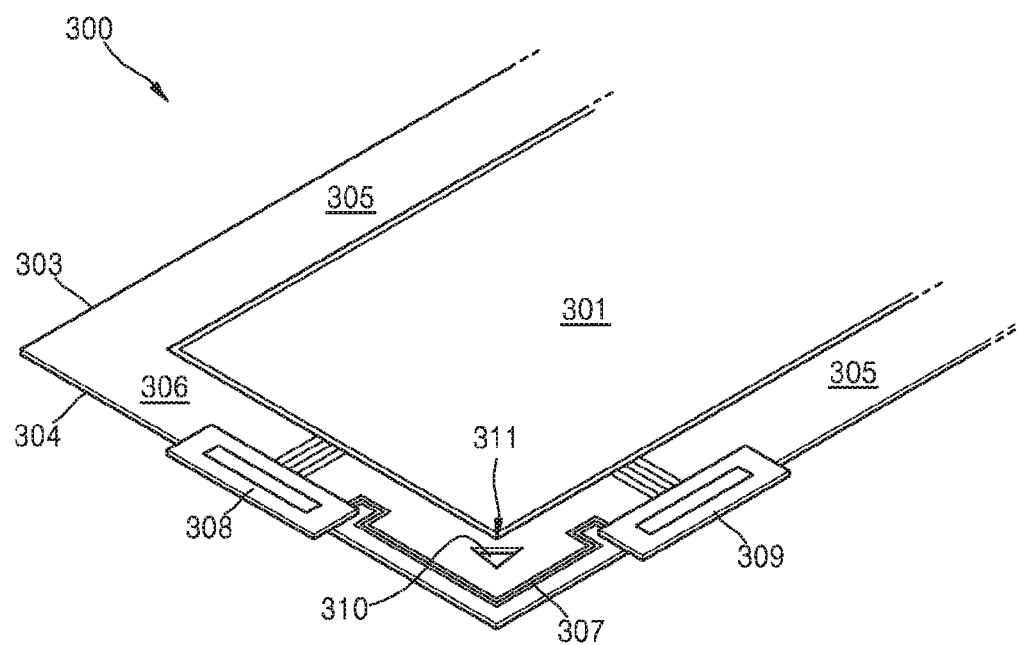
FIG. 3B is a cut partial perspective view illustrating a bending hole of the flexible display panel of FIG. 3A.

FIG. 3B is a cut partial perspective view illustrating a bending hole 310 of the flexible display panel 300 of FIG. 3A.

Referring to FIG. 3B, the first edge 305 can be formed in the first inactive area 303 corresponding to a long side of the flexible display panel 300, and the second edge 306 can be formed in the second inactive area 304 corresponding to a short side of the flexible display panel 300.

The bending hole 310 can be formed at a corner 311 of the flexible display panel 300 such that the flexible display panel 300 is easily folded when the first and second edges 305 and 306 are folded in a direction opposite to a direction in which the flexible display panel 300 displays an image.

For example, the bending hole 310 can be formed at the corner 311 where the first and second edges 305 and 306, which are adjacently arranged, meet. A folding region 312 of FIG. 3D that is folded at least once can be formed at the corner 311 where the bending hole 310 is formed.

The bending hole 310 can be formed so as to not overlap the wires 307. According to the current embodiment, the bending hole 310 can be formed between the active area 301 and a region where the wires 307 are formed. According to at least some exemplary embodiments, the location of the bending hole 310 is not limited thereto as long as the bending hole 310 does not overlap the wires 307. For example, the bending hole 310 can be formed outside the region where the wires 307 are formed (i.e., closer to the edge of the inactive area 302 than the wires 307).

The bending hole 310 can penetrate through the flexible display panel 300 in a thickness direction thereof. According to an exemplary embodiment, the bending hole 310 penetrates through both the flexible substrate 210 of FIG. 2 and the reinforcing film 230 of FIG. 2 at substantially the same location.

The bending hole 310 can be a closed curve surrounded by regions of the first edges 305 and regions of the second edges 306. According to the current embodiment, the bending hole 310 has a triangular shape, however, in alternate embodiments, the bending hole 310 has any one of polygonal shape, a circular shape, and/or an oval shape. Alternatively, the bending hole 310 can be formed by cutting at least a region of the first edge 305 and at least a region of the second edge 306 along the corner 311.

The bending hole 310 can extend throughout the first and second edges 305 and 306 that are adjacent to each other. According to the current embodiment, the number of bending holes 310 formed in at least one corner 311 of the inactive area 302 is one, but a plurality of bending holes 310 can be formed at the corner 311.

Figure 3C:
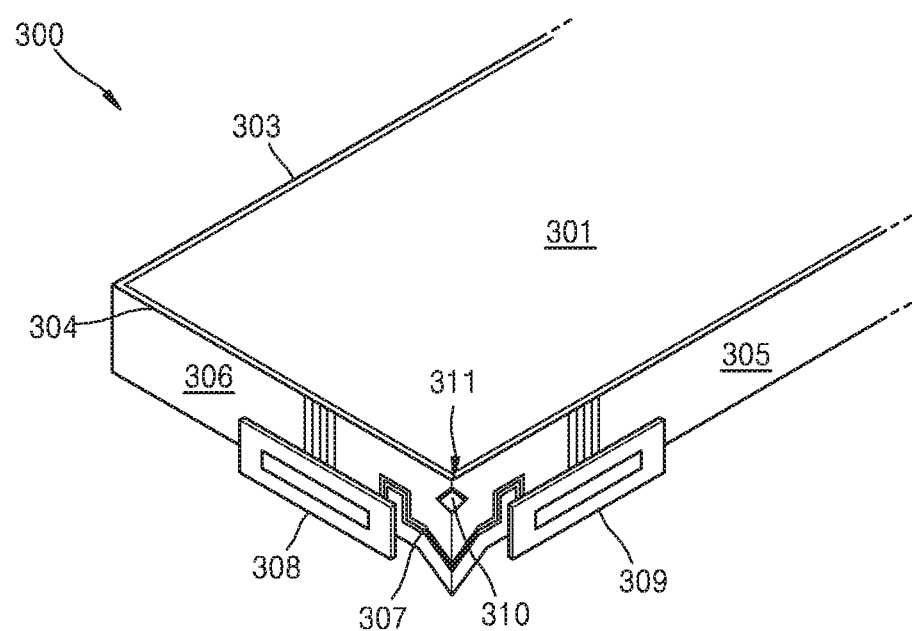
FIG. 3C is a cut partial perspective view of the flexible display panel of FIG. 3B, which is folded.

FIG. 3C is a cut partial perspective view of the flexible display panel 300 of FIG. 3B, which is folded.

Referring to FIG. 3C, the first and second edges 305 and 306 of the flexible display panel 300 can be folded at least once. According to the current embodiment, the first and second edges 305 and 306 are folded once, but when the flexible display panel 300 is applied to a large flexible display, the first and second edges 305 and 306 can be folded at least twice.

The first and second edges 305 and 306 can be folded together in a direction opposite to a direction in which the flexible display panel 300 displays an image. According to the current embodiment, four surfaces of the flexible display panel 300 can be folded together.

When the first and second edges 305 and 306 are folded, interference between the first and second edges 305 and 306 may be generated at the corner 311. When the interference is generated, the wires 307 passing through the corner 311 may crack or may be detached.

Figure 3D:
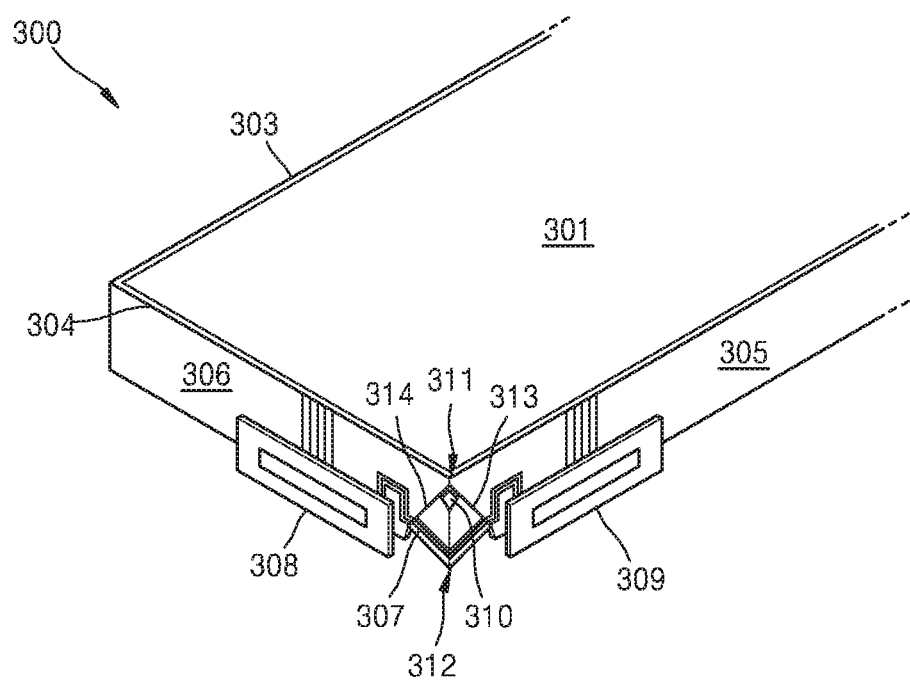
FIG. 3D is a cut partial perspective view of the flexible display panel of FIG. 3C, wherein a corner is folded.

FIG. 3D is a cut partial perspective view of the flexible display panel 300 of FIG. 3C, wherein the corner 311 is folded.

Referring to FIG. 3D, a folding region 312 is formed by folding the corner 311 where the bending hole 310 is formed.

The folding region 312 is formed by folding the corner 311 at least once. For example, the folding region 312 is formed by folding a region 313 of the first edge 305 and a region 314 of the second edge 306 at least once in a diagonal direction.

The folding region 312 protrudes from the first and second edges 305 and 306 that are adjacent to the corner 311 and can be formed on the first and second edges 305 and 306 that are adjacent to the corner 311 in an overlapping manner.

The wires 307 extending to the first and second edges 305 and 306 and passing through the corner 311 can be formed on the folding region 312.

As described above, even when the first and second edges 305 and 306, which are adjacent to each other, are folded at the same time, the ease of folding the flexible display panel 300 at the corner 311 can be increased, due to the existence of the folding region 312 including the bending hole 310. Accordingly, cracks or detachment of the wires 307, cracks of a flexible substrate, or detachment of a functional layer on the flexible substrate, which may be generated when folding the flexible display panel 300, can be prevented.

Figure 3E:
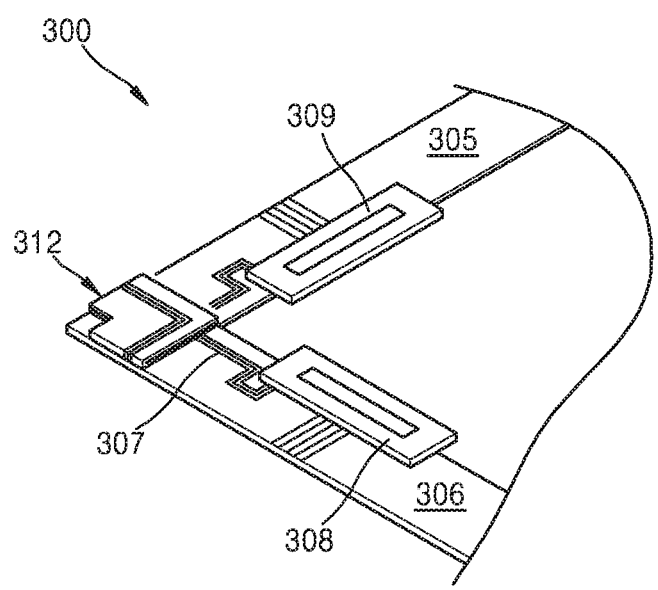
FIG. 3E is a cut partial perspective view of a rear surface of the flexible display panel of FIG. 3D, which is folded.
Figure 3F:
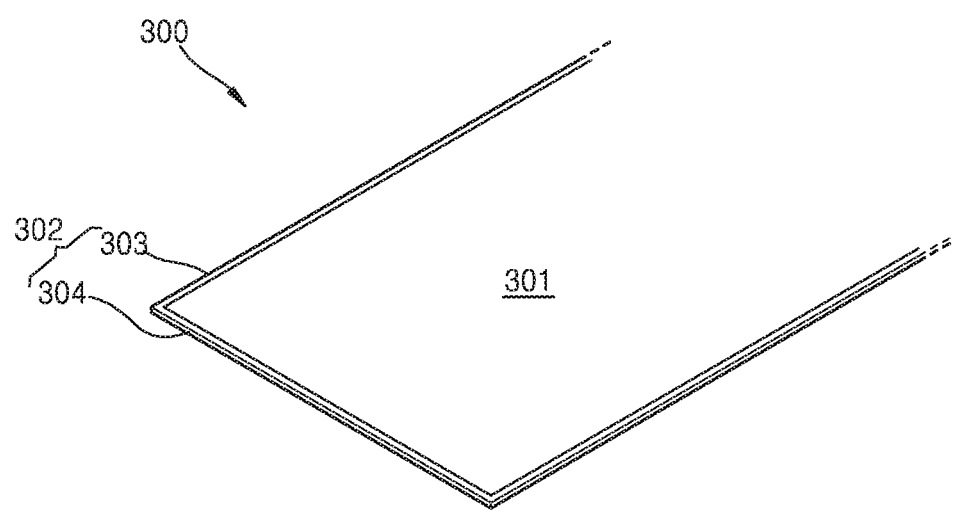
FIG. 3F is a cut partial perspective view of a front surface of the flexible display panel of FIG. 3D, which is folded.

FIG. 3E is a cut partial perspective view of a rear surface of the flexible display panel 300 of FIG. 3D, which is folded. FIG. 3F is a cut partial perspective view of a front surface of the flexible display panel 300 of FIG. 3D, which is folded.

Referring to FIGS. 3E and 3F, the first and second edges 305 and 306 are folded together to the rear surface of the flexible display panel 300, i.e., in a direction opposite to a direction in which the flexible display panel 300 displays an image. Accordingly, only the active area 301 is provided on the front surface of the flexible display panel 300, and the inactive area 302 can be reduced in size. For example, a bezel of the flexible display panel 300 can be formed to have a width that is less than or equal to about 1 mm.

Processes for folding the flexible display panel 300 having a structure described above will now be described with reference to FIGS. 3A through 3F.

The flexible display panel 300 is prepared as shown in FIG. 3A. The flexible display panel 300 includes the active area 301 for displaying an image and the inactive area 302 surrounding the active area 301. The inactive area 302 includes the first inactive areas 303 and the second inactive areas 304. The first inactive areas 303 include the first edges 305 and the second inactive areas 304 include the second edges 306.

The wires 307 and the drivers, i.e., the gate driver 308 and the data driver 309, are placed and/or formed in the inactive area 302.

Then, as shown in FIG. 3B, the bending hole 310 is formed at the corner 311 where the first and second edges 305 and 306 that are adjacent to each other meet. The bending hole 310 penetrates through the flexible display panel 300 in a thickness direction. According to an exemplary embodiment, the bending hole 310 is formed between the active area 301 and a region where the wires 307 are formed.

Then, as shown in FIG. 3C, the first and second edges 305 and 306 are folded at least once in a downward direction of the flexible display panel 300, i.e., in a direction opposite to a direction in which the flexible display panel 300 displays an image. According to an exemplary embodiment, four surfaces of the flexible display panel 300 are folded at the same time.

Then, as shown in FIG. 3D, the folding region 312 is formed by folding the corner 311 where the bending hole 310 is formed.

The folding region 312 is formed by folding the region 313 of the first edge 305 and the region 314 of the second edge 306 at least once. The folding region 312 is provided on the first and second edges 305 and 306 that are adjacent to the corner 311 in an overlapping manner.

Then, as shown in FIG. 3E, the first edge 305, the second edge 306, and the folding region 312 are folded together to the rear surface of the flexible display panel 300, i.e., to a surface opposite to a surface the flexible display panel 300 that can display an image.

Accordingly, as shown in FIG. 3F, substantially only the active area 301 is visible from the front surface of the flexible display panel 300, i.e., the surface the flexible display panel 300 that can display an image, and a bezel thereof can be reduced in size.

Figure 4:
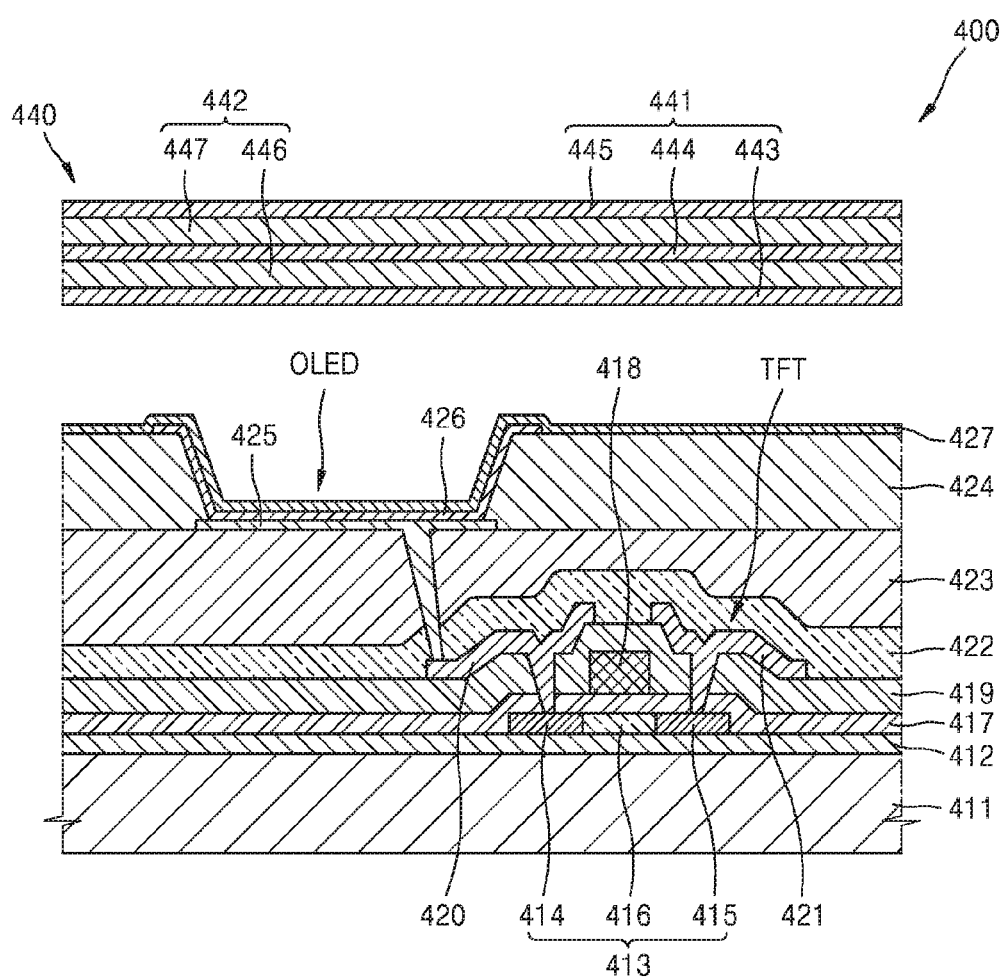
FIG. 4 is a cross-sectional view of a sub-pixel of a flexible display panel, according to an exemplary embodiment.

FIG. 4 is a cross-sectional view of a sub-pixel of a flexible display panel 400, according to an exemplary embodiment.

According to the current embodiment, the flexible display panel 400 can be a panel of an OLED display.

Referring to FIG. 4, the flexible display panel 400 includes a flexible substrate 411 and an encapsulation film 440 formed on the flexible substrate 411.

The flexible substrate 411 can be a flexible glass substrate or a flexible polymer substrate. The flexible substrate 411 can be transparent, semi-transparent, or opaque.

A barrier film 412 can be formed on the flexible substrate 411. The barrier film 412 can completely cover a top surface of the flexible substrate 411. The barrier film 412 can include an inorganic material or an organic material. The barrier film 412 can be a single film or a multi-layer film. The barrier film 412 blocks the penetration of oxygen or moisture into a thin-film transistor TFT and flattens or planarizes a top surface of the flexible substrate 411.

The thin-film transistor TFT can be formed on the barrier film 412. According to an exemplary embodiment, the thin-film transistor TFT is a top gate transistor, but alternatively, can be any other transistor, such as a bottom gate transistor.

A semiconductor active layer 413 is formed on the barrier film 412.

The semiconductor active layer 413 includes a source region 414 and a drain region 415, which are formed by doping with N-type impurity ions and/or P-type impurity ions. A channel region 416, which is not doped with impurities, is formed between the source region 414 and the drain region 415. The semiconductor active layer 413 can include an organic semiconductor, an inorganic semiconductor, or amorphous silicon. According to an exemplary embodiment, the semiconductor active layer 413 includes an oxide semiconductor.

A gate insulating film 417 is deposited on the semiconductor active layer 413. The gate insulating film 417 can be an inorganic film. The gate insulating film 417 can be a single layer or a multi-layer film.

A gate electrode 418 can be formed on the gate insulating film 417. The gate electrode 418 can include a metal material having excellent conductivity. The gate electrode 418 can include a single layer or a multi-layer film.

An interlayer insulating film 419 can be formed on the gate electrode 418. The interlayer insulating film 419 can be an inorganic film or an organic film.

A source electrode 420 and a drain electrode 421 are formed on the interlayer insulating film 419. For example, a pair of contact holes are formed in the gate insulating film 417 and interlayer insulating film 419 by removing portions of the gate insulating film 417 and interlayer insulating film 419. The source electrode 420 can be electrically connected to the source region 414 and the drain electrode 421 can be electrically connected to the drain region 415 through the contact holes.

A passivation film 422 is formed on the source and drain electrodes 420 and 421. The passivation film 422 can be an inorganic film or an organic film. A planarization film 423 is formed on the passivation film 422. The planarization film 423 includes an organic film. In some embodiments, any one of the passivation film 422 and the planarization film 423 may not be formed.

The thin-film transistor TFT may be electrically connected to an OLED.

The OLED is formed on the planarization film 423. The OLED includes a first electrode 425, an intermediate layer 426, and a second electrode 427.

The first electrode 425 operates as an anode and can include any one of various conductive materials. The first electrode 425 can be a transparent electrode or a reflective electrode. For example, when the first electrode 425 is a transparent electrode, the first electrode 425 includes a transparent conductive film. When the first electrode 425 is a reflective electrode, the first electrode 425 can include a reflective film and a transparent conductive film formed on the reflective film.

A pixel-defining layer 424 covers a portion of the planarization film 423 and first electrode 425. The pixel-defining layer 424 defines an emission region for each sub-pixel by surrounding and/or covering an edge of the first electrode 425. The first electrode 425 can be patterned so as to define the sub-pixels.

The pixel-defining layer 424 can be formed of an organic film or an inorganic film. The pixel-defining layer 424 can be a single layer or a multi-layer film.

The intermediate layer 426 is formed on a region of the first electrode 425, which is exposed by etching a portion of the pixel-defining layer 424. The intermediate layer 426 can be formed via a deposition process.

The intermediate layer 426 can include an organic emission layer. Alternatively, for example, the intermediate layer 426 can include an organic emission layer, and can further include at least one of a hole injection layer (HIL), a hole transport layer (HTL), an electron transport layer (ETL), and an electron injection layer (EIL). However, the described technology is not limited thereto, and the intermediate layer 426 can include an organic emission layer and further include other various functional layers.

The second electrode 427 is formed on the intermediate layer 426.

The second electrode 427 can operate as a cathode. The second electrode 427 can be a transparent electrode or a reflective electrode. When the second electrode 427 is a transparent electrode, the second electrode 427 can include a metal film and a transparent conductive film formed on the metal film. When the second electrode 427 is a reflective electrode, the second electrode 427 includes a metal film.

According to an exemplary embodiment, a plurality of sub-pixels can be formed on the flexible substrate 411, wherein red, green, blue, or white light can be emitted from respective sub-pixels. However, the described technology is not limited thereto.

The encapsulation film 440 is formed to protect the OLED from external moisture or oxygen. According to an exemplary embodiment, the encapsulation film 440 can be formed by alternately stacking an inorganic film 441 and an organic film 442. For example, the inorganic film 441 includes a first inorganic film 443, a second inorganic film 444, and a third inorganic film 445. The organic film 442 includes a first organic film 446 and a second organic film 447.

According to an exemplary embodiment, a flexible display panel can be a portion of an LCD.

As is widely known, LCDs include a first substrate, a second substrate, and liquid crystal layer injected between the first and second substrates.

An LCD includes a plurality of gate lines, a plurality of data lines formed perpendicular to the gate lines, a plurality of pixel electrodes in pixel regions defined where the gate lines and the data lines cross each other, and a plurality of thin-film transistors each configured to transmit a signal received from a corresponding one of the data lines to a corresponding pixel electrode when switched by a signal received from a corresponding one of the gate lines can each be formed on the first substrate.

A black matrix for blocking light in regions other than the pixel regions, a color filter for displaying colors, and a common electrode can be formed on the second substrate.

According to at least one exemplary embodiment, an LCD includes one flexible substrate so as to be formed with a thin profile. For example, a first electrode, a second electrode insulated from the first electrode and defining a tunnel-shaped cavity extending between the first and second electrodes, liquid crystal provided in the tunnel-shaped cavity, and a protection layer covering the second electrode and sealing the tunnel-shaped cavity can be formed on the one flexible substrate. A color filter can be provided between the second electrode and the protection layer.

As described above, in a flexible display and a method of manufacturing the same according to at least one embodiment, a narrow bezel can be realized since the edges of a flexible display panel can be easily folded behind the flexible display panel.

While one or more exemplary embodiments have been described with reference to the figures, it will be understood by those of ordinary skill in the art that various changes in form and details can be made therein without departing from the spirit and scope of the invention as defined by the following claims.

What is claimed is:

1. A flexible display, comprising:
   a flexible display panel comprising an active area configured to display an image and an inactive area surrounding the active area; and
   a plurality of wires formed over the flexible display panel in the inactive area and configured to transmit an electric signal to the active area,
   wherein the inactive area comprises a plurality of edges that are bent with respect to the active area of the flexible display panel,
   wherein a bending hole is formed at each corner where two adjacent edges of the flexible display panel meet, and
   wherein each of the corners is folded so as to define a folding region.

2. The flexible display of claim 1, wherein each of the bending holes does not overlap the wires.

3. The flexible display of claim 2, wherein each of the bending holes is interposed between an adjacent set of the wires and the active area.

4. The flexible display of claim 1, wherein each of the bending holes penetrates through the flexible display panel in a thickness direction thereof.

5. The flexible display of claim 1, wherein each of the bending holes defines a closed curve surrounded by at least one of the edges.

6. The flexible display of claim 5, wherein each of the bending holes is surrounded by two adjacent edges.

7. The flexible display of claim 1, wherein each of the folding regions overlaps the two adjacent edges at the corresponding corner.

8. The flexible display of claim 7, wherein the wires comprise a plurality of sets of wires and wherein each of the sets of wires extends between two adjacent edges and via the corresponding corner.

9. The flexible display of claim 1, wherein the edges are folded at least once in a direction opposite to a direction in which the flexible display panel is configured to display an image.

10. The flexible display of claim 1, wherein the edges are folded to a first surface of the flexible display panel that opposes a second surface of the flexible display panel that is configured to display an image.

11. The flexible display of claim 1, wherein the inactive area surrounds the active area and wherein the edges are folded in a direction opposite to a direction in which the flexible display panel is configured to display an image along a circumference of the active area.

12. The flexible display of claim 11, wherein the inactive area comprises a plurality of first inactive areas opposing each other in a first direction and a plurality of second inactive areas opposing each other in a second direction, wherein each of the bending holes is formed at a corresponding one of the corners where a first edge of the first inactive areas and an adjacent second edge of the second inactive areas meet.

13. The flexible display of claim 12, wherein the active area has a quadrangular shape and wherein the edges comprise four edges which are folded together.

14. The flexible display of claim 1, wherein the flexible display panel comprises:
at least one flexible substrate;
a plurality of light-emitting devices formed on the flexible substrate; and
a plurality of insulating layers insulating the light-emitting devices from each other,
wherein a reinforcing film is attached to the flexible substrate.

15. The flexible display of claim 14, wherein each of the bending holes penetrates through the flexible substrate and the reinforcing film at substantially the same location in a thickness direction of the flexible display panel.

16. The flexible display of claim 14, wherein the flexible substrate comprises at least one of: a flexible glass substrate and a flexible polymer substrate.

17. The flexible display of claim 1, wherein a radius of curvature of the flexible display panel is less than or equal to about 1 mm.

18. A method of manufacturing a flexible display, comprising:
providing a flexible display panel comprising an active area configured to display an image and an inactive area surrounding the active area, wherein the inactive area comprises a plurality of edges;
forming a plurality of wires in the inactive area, wherein the wires are configured to transmit an electric signal to the active area;
forming a bending hole at each of a plurality of corners where two adjacent edges of the flexible display panel meet;
bending each of the edges of the inactive area with respect to the active area of the flexible display panel; and
forming a folding region by folding each of the corners at least once.

19. The method of claim 18, wherein the bending of each of the edges comprise folding each of the edges at least once in a direction opposite to a direction in which the flexible display panel is configured to display an image and wherein the folding region overlaps the two adjacent edges at the corresponding corner.

20. The method of claim 18, wherein the bending of each of the edges comprises folding the edges together to a first surface of the flexible display panel that opposes a second surface of the flexible display panel that is configured to display an image.

* * * * *